(12) United States Patent
Yin

(10) Patent No.: US 9,653,550 B2
(45) Date of Patent: May 16, 2017

(54) MOSFET STRUCTURE AND MANUFACTURING METHOD THEREOF

(71) Applicant: Institute of Microelectronics, Chinese Academy of Sciences, Beijing (CN)

(72) Inventor: Haizhou Yin, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/904,871

(22) PCT Filed: Oct. 22, 2013

(86) PCT No.: PCT/CN2013/085661
§ 371 (c)(1),
(2) Date: Jan. 13, 2016

(87) PCT Pub. No.: WO2015/051563
PCT Pub. Date: Apr. 16, 2015

(65) Prior Publication Data
US 2016/0204199 A1     Jul. 14, 2016

(30) Foreign Application Priority Data

Oct. 13, 2013     (CN) .......................... 2013 1 0476543

(51) Int. Cl.
*H01L 29/10*     (2006.01)
*H01L 29/08*     (2006.01)
(Continued)

(52) U.S. Cl.
CPC ...... *H01L 29/1033* (2013.01); *H01L 29/0847* (2013.01); *H01L 29/1054* (2013.01);
(Continued)

(58) Field of Classification Search
CPC ..... H01L 29/06; H01L 29/08; H01L 29/1054; H01L 29/6653; H01L 29/66545;
(Continued)

(56) References Cited

U.S. PATENT DOCUMENTS

| 8,455,858 B2 | 6/2013 | Wang et al. |
| 2009/0108361 A1* | 4/2009 | Wei ................... H01L 21/26506 257/368 |

(Continued)

FOREIGN PATENT DOCUMENTS

| CN | 101819996 A | 9/2010 |
| CN | 102437127 A | 5/2012 |

(Continued)

OTHER PUBLICATIONS

International Search Report and Written Opinion mailed on Jul. 16, 2014 in International Application PCT/CN2013/085661.

*Primary Examiner* — Jarrett Stark
*Assistant Examiner* — Shahed Ahmed
(74) *Attorney, Agent, or Firm* — Pillsbury Winthrop Shaw Pittman LLP

(57) ABSTRACT

A MOSFET structure and a method for manufacturing the same are disclosed. The method comprises: a. providing a substrate (100); b. forming a silicon germanium channel layer (101), a dummy gate structure (200) and a sacrificial spacer (102); c. removing the silicon germanium channel layer and portions of the substrate which are not covered by the dummy gate structure (200) and located under both sides of the dummy gate structure 200, so as to form vacancies (201); d. selectively epitaxially growing a first semiconductor layer (300) on the semiconductor structure to fill bottom and sidewalls of the vacancies (201); and e. removing the sacrificial spacer (102) and filling a second semiconductor layer (400) in the vacancies which are not filled by the first semiconductor layer (300). In the semiconductor structure of (Continued)

the present disclosure, carrier mobility in the channel can be increased, negative effects induced by the short channel effects can be suppressed, and device performance can be enhanced.

11 Claims, 4 Drawing Sheets

(51) Int. Cl.
    *H01L 29/161*     (2006.01)
    *H01L 29/66*     (2006.01)
    *H01L 29/78*     (2006.01)
    *H01L 29/49*     (2006.01)
    *H01L 29/51*     (2006.01)
    *H01L 29/165*     (2006.01)

(52) U.S. Cl.
    CPC ........ *H01L 29/161* (2013.01); *H01L 29/6653* (2013.01); *H01L 29/66492* (2013.01); *H01L 29/66545* (2013.01); *H01L 29/66636* (2013.01); *H01L 29/7834* (2013.01); *H01L 29/7848* (2013.01); *H01L 29/165* (2013.01); *H01L 29/4966* (2013.01); *H01L 29/517* (2013.01)

(58) Field of Classification Search
    CPC .............. H01L 29/66636; H01L 29/78; H01L 29/7834; H01L 29/7848; H01L 29/165; H01L 29/4966; H01L 29/517
    USPC ........ 257/288, 368, 369, 382, 408; 438/151, 438/197, 199, 300
    See application file for complete search history.

(56) References Cited

U.S. PATENT DOCUMENTS

| | | | |
|---|---|---|---|
| 2010/0308379 A1* | 12/2010 | Kuan | H01L 21/823807 257/288 |
| 2012/0175713 A1* | 7/2012 | Li | H01L 21/302 257/408 |
| 2012/0319181 A1* | 12/2012 | Yin | H01L 29/66772 257/288 |
| 2013/0040435 A1 | 2/2013 | Yin | |
| 2013/0056836 A1 | 3/2013 | Yu et al. | |
| 2013/0228862 A1* | 9/2013 | Lee | H01L 21/823807 257/347 |
| 2013/0309829 A1* | 11/2013 | Fang | H01L 21/26506 438/285 |
| 2013/0320449 A1* | 12/2013 | Hoentschel | H01L 21/823807 257/368 |
| 2014/0203333 A1* | 7/2014 | Huang | H01L 29/4966 257/288 |
| 2015/0001584 A1* | 1/2015 | Huang | H01L 29/0847 257/192 |

FOREIGN PATENT DOCUMENTS

| | | |
|---|---|---|
| CN | 102737996 A | 10/2012 |
| CN | 102969347 A | 3/2013 |
| KR | 20040058797 A | 7/2004 |

\* cited by examiner

MOSFET STRUCTURE AND MANUFACTURING METHOD THEREOF

CROSS REFERENCE TO RELATED APPLICATION

This application is a national stage application, filed under 35 U.S.C. §371, of PCT Application No. PCT/CN2013/085661, filed on Oct. 22, 2013, entitled "MOSFET STRUCTURE AND MANUFACTURING METHOD THEREOF", which claimed priority to Chinese Application No. 201310476543.6, filed on Oct. 13, 2013, all of which are hereby incorporated by reference in their entirety.

TECHNICAL FIELD

The present disclosure relates to a Metal Oxide Semiconductor Field Effect Transistor (MOSFET) and a method for manufacturing the same. Specifically, the present disclosure relates to a MOSFET having reduced leakage current in off-state and a method for manufacturing the same.

BACKGROUND

As the device becomes thinner, band-to-band-tunneling in off-state of the device may bring about larger gate-induced drain leakage current, which has been one of the issues severely affecting MOSFET and flash memory. GIDL current may induce hot hole injection such that the hole may be trapped in the gate oxidation layer, which may lead to instability of the device and possible punching-through of the gate oxidation layer. Therefore, as the thickness of the oxidation layer decreases, the reliability of the oxidation layer in off-state of the device becomes more important, which has drawn more attention in recent years.

The GIDL may be reduced by conventional techniques. For example, the temperature for forming the gate oxidation layer may be increased to 1000-1100° C. The surface state density of the substrate can be reduced by increasing the oxidation temperature, so as to reduce the GIDL. The gate oxidation layer can be formed by conventional processes including Rapid Thermal Oxidation (RTO) and In-Situ Steam Generation (ISSG). However, the gate oxidation layer formed by RTO may have less uniformity than by oxidation furnace, which may lead to disadvantageous large variation of the threshold voltage of the device. In addition, as the dimension of the device is scaled down to 55 nm process and beyond, the oxidation layer formed by ISSG may have a decreased control for the reduction of the GIDL current.

The GIDL may also be reduced by decreasing the concentration of the Lightly-Doped Drain (LDD) region. As scaling down of device dimension, short channel effects have been an increasingly severe problem. The short channel effects may be suppressed by formation of the LDD. In order to suppresses the short channel effects, the LDD must have a ultra-shallow junction. However, the LDD may have increased concentration so as to avoid reduction of the driving current. If the GIDL current has been decreased by reducing the concentration of the LDD, the resistance of the channel may be increased and the driving current may be reduced, which may deteriorate device performance. Therefore, it is disadvantageous to reduct GIDL current by lowering the concentration of the LDD for future Integrated Circuits (IC) device.

It has been an urgent challenge to be solved for providing a method for manufacturing a MOS transistor with effectively reduced GIDL current.

SUMMARY OF THE INVENTION

The present disclosure provides a method for manufacturing a MOS transistor with effectively reduced GIDL current, which can suppress short channel effects and improve device performance. Specifically, the present disclosure provides a method for manufacturing a MOSFET, comprising:
a. providing a substrate;
b. forming a silicon germanium channel layer, a dummy gate structure and a sacrificial spacer;
c. removing the silicon germanium channel layer and portions of the substrate which are not covered by the dummy gate structure and located under both sides of the dummy gate structure, so as to form vacancies;
d. selectively epitaxially growing a first semiconductor layer on the semiconductor structure to fill the bottom and sidewalls of the vacancies; and
e. removing the sacrificial spacer and filling a second semiconductor layer in the vacancies which are not filled by the first semiconductor layer.

The silicon germanium channel layer has a thickness of about 3-6 nm.

The vacancies are formed by combination of anisotropic etching and isotropic etching. The overlapping length H of the vacancies and the dummy gate structure is 5-10 nm.

The first semiconductor layer has a band gap larger than that of the silicon germanium channel layer, and the first semiconductor layer is formed of silicon, and the second semiconductor layer is formed of silicon or germanium. If the second semiconductor layer is formed of silicon germanium, germanium therein has a percentage smaller than that in the silicon germanium channel layer.

The second semiconductor layer is filled by epitaxial growing or CVD.

After step 3, the method further comprises:
f. forming source/drain extension regions, spacers, source/drain regions and an interlayer dielectric layer; and
g. removing the dummy gate structure to form dummy gate vacancies, and sequentially depositing a gate dielectric layer, a work function adjusting layer and a metal gate layer in the dummy gate vacancies.

Accordingly, the disclosure provides a MOSFET structure, comprising: a substrate, a silicon germanium channel layer located on the substrate, a gate stack on the silicon germanium channel layer, a first semiconductor layer and a second semiconductor layer in the substrate on both sides of the gate stack, source/drain extension regions and source/drain regions in the first semiconductor and the second semiconductor, and an interlayer dielectric layer covering the gate stack and the source/drain regions, wherein
the first semiconductor layer has a larger band gap that the silicon germanium channel layer.

The first semiconductor layer is located under edges of the gate stack, and the maximum overlapping length H with the gate stack is larger than the length L of the source/drain extension regions.

The silicon germanium channel layer has a thickness of about 3-6 nm.

The overlapping length H of the first semiconductor layer with the gate stack is 5-10 nm.

The second semiconductor layer is formed of silicon or silicon germanium.

If the second semiconductor layer is formed of silicon germanium, the germanium therein has a percentage smaller than that in the silicon germanium channel layer.

According to the MOSFET structure of the present disclosure, the material of the channel near the drain region (that is, a region which is influenced by the GIDL effect) is replaced by a semiconductor material having a larger band gap, which may effectively reduce the leakage current induced by the GIDL effects. Further, the source/drain regions are filled with a semiconductor material having a larger bad gap, which may apply a stress to the channel and increase carrier mobility in the channel. Compared with the prior art, the present disclosure can effectively suppress the negative effects induced by the short channel effects, and enhance device performance.

DESCRIPTION OF DRAWINGS

After reading the following detailed description of the non-limiting embodiments in connection with the attached drawings, other features, objectives and advantages of the present disclosure will be more apparent.

In the attached drawings, the same or similar reference numbers donate the same or similar elements.

DETAILED DESCRIPTION

Figure 1:
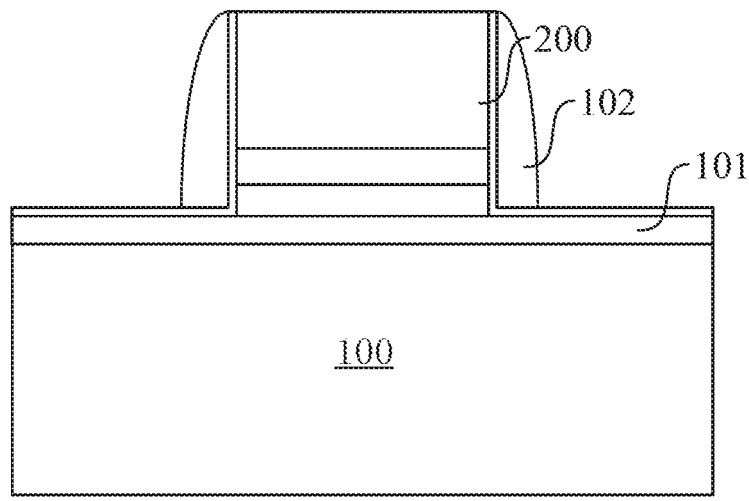
FIGS. 1-8 are cross-section diagrams of structures in stages of a method for manufacturing a MOSFET according to an embodiment of the present disclosure.

In the following, in order to make objectives, technical solutions and advantages of the present disclosure more clearer, embodiments of the present disclosure will be described in detail in connection with the attached drawings.

Hereinafter, embodiments of the present disclosure are described. Examples of the embodiments are shown in the attached drawings. The same or similar reference numbers denote the same or similar elements or elements having the same or similar function throughout the drawings. Embodiments described with reference to the drawings are illustrative only, and are intended to interpret the invention rather than limiting the invention.

The present disclosure provides a MOSFET comprising: a semiconductor substrate 100, a silicon germanium channel layer 101, a first semiconductor layer 300, a second semiconductor layer 400, source/drain extension regions 210, source/drain regions 202, an interlayer dielectric layer 500 and a gate stack 600, wherein the first semiconductor layer 300 is made of a material having a larger forbidden band gap than that of the silicon germanium channel layer 101.

The first semiconductor layer 300 is located under edges of the gate stack 600, and has an overlapping area with a maximum thickness H larger than the length L of the source/drain extension regions 210. The silicon germanium channel layer 101 has a thickness of about 3-6 nm, and the first semiconductor layer 300 has a thickness of about 5-10 nm.

The second semiconductor layer 400 may be made of silicon or silicon germanium in which germanium has a percentage smaller than that in the silicon germanium channel layer 101.

The semiconductor channel is located on a surface of the substrate, may be preferably made of single crystalline silicon with a thickness of about 5-20 nm. The channel may be lightly doped or undoped. In a case where the channel is doped, the channel may have a doping type opposite to that of the source/drain regions.

The source/drain regions are located on both sides of the gate stack 600 in semiconductor layer on the substrate 100. The source region has a thickness larger than that of the drain region. The portion of the channel near the source region has a thickness larger than that near the drain region, and may have a thickness of about 10-60 nm.

In the following, the manufacturing method is described in connection with the attached drawings. It should be noted that the drawings in embodiments of the present disclosure are illustrative only, and are not drawn to scale.

As illustrated in FIG. 1, a silicon germanium channel layer 101 is formed on the substrate. The silicon germanium channel layer has a thickness not more than 6 nm. Specifically, the silicon germanium channel layer 101 may be formed by Atomic Layer Deposition (ALD), and the percentage of germanium in the silicon germanium channel layer 101 may be adjusted by controlling the percentage of the reaction atoms.

Next, a dummy gate structure 200 is formed on the substrate 100. The dummy gate structure 200 may be a single-layer structure, or may be a multi-layer structure. The dummy gate structure 200 may be made of polymer materials, amorphous silicon, polysilicon or TiN, and may have a thickness of about 10-200 nm. In the present embodiment, the dummy gate may comprise polysilicon and silicon dioxide. Specifically, polysilicon may be filled into the gate vacancy by Chemical Vapor Deposition (CVD) with a height slightly lower than the spacer by 10-20 nm. Then, a silicon dioxide layer is formed on the polysilicon layer by, for example, epitaxially growing, oxidation or CVD, etc. Next, the dummy gate structure is processed by lithography and etching in conventional CMOS processes to form a gate electrode pattern. The channel region of the transistor is formed by the portion of the Silicon Germanium channel layer 101 covered by the gate dielectric layer. It should be noted that if not stated otherwise, the deposition of various dielectric materials in the present embodiment may be formed by the method for forming the gate dielectric layer described above, and may be omitted here.

Optionally, a sacrificial spacer 102 is formed on sidewalls of the gate stack to isolate the gate electrode, as shown in FIG. 1. Specifically, a sacrificial spacer dielectric layer of silicon nitride with a thickness of about 40-80 nm may be deposited by LPCVD. Then, the sacrificial spacer 102 of silicon nitride with a thickness of about 35-75 nm is formed on both sides of the gate electrode by a etching back process. The sacrificial spacer 102 may also be formed of silicon oxide, silicon oxynitride, silicon carbide or combinations thereof, and/or other materials as appropriate. The sacrificial spacer 102 may have a multi-layer structure. The sacrificial spacer 102 may also be formed by processes such as deposition and etching, and may have a thickness of about 10-100 nm, for example, 30 nm, 50 nm or 80 nm.

Figure 2:
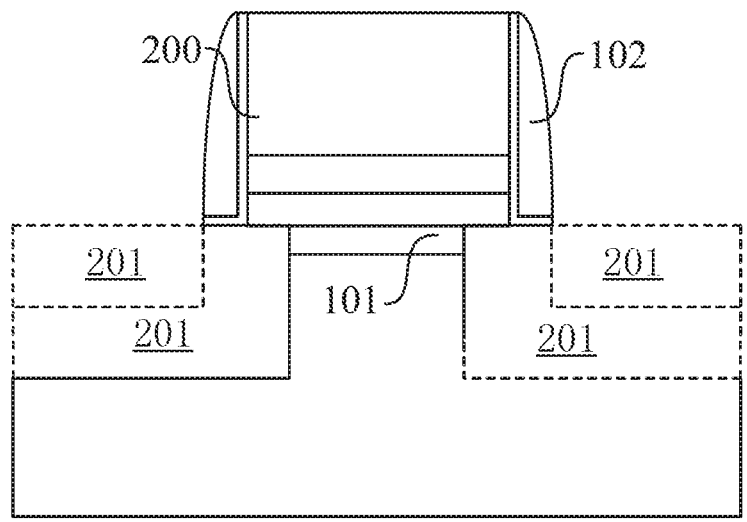

Next, the silicon germanium channel layer 101 and portions of the substrate 100, which are not covered by the dummy gate structure 200 and located under both sides of the dummy gate structure 200, are removed, so as to form vacancies 201, as shown in FIG. 2. Specifically, the semiconductor structure is anisotropically etched by dry-etching with the dummy gate structure 200 and the sacrificial spacer 102 as a mask. The etching depth may be $\frac{1}{3}$-$\frac{1}{2}$ of the depth of the vacancies 201. Next, isotropic etching is performed inside the vacancies to remove the silicon germanium channel layer 101 and portion of the substrate 100 under both sides of the dummy gate structure 200. After the etching process, the vacancies 201 are formed in the semiconductor structure. The vacancies 201 are located on both sides of the dummy gate structure 200, and the overlapping length H with the dummy gate structure 200 is 5-10 nm.

Figure 3:
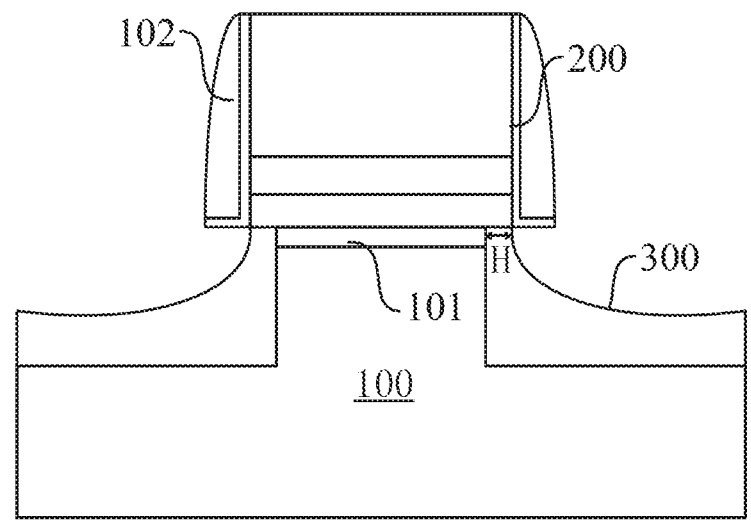

Next, a first semiconductor layer 300 is selectively epitaxially grown on the semiconductor structure to fill the bottom and sidewalls of the vacancies 201. Specifically, a first semiconductor layer 300 is grown on exposed surfaces of the vacancies 200. The band gap of the first semiconductor layer 300 is larger than that of the silicon germanium channel layer 101. Because the leakage current induced by the GIDL is closely related to the band gap of the semiconductor material in the GIDL region, and may decrease with the increase of the band gap of the semiconductor material, the band gap of the GIDL region may be effectively increased by replacing the silicon germanium channel layer with the first semiconductor layer 300 having a relative larger band gap, so as to reduce leakage current and enhance device performance. In the present embodiment, preferably, silicon is epitaxially grown as the first semiconductor layer 300 such that the grown silicon layer is flushed with the border of the dummy gate structure 200. The semiconductor structure after epitaxial growing is shown in FIG. 3.

Figure 4:
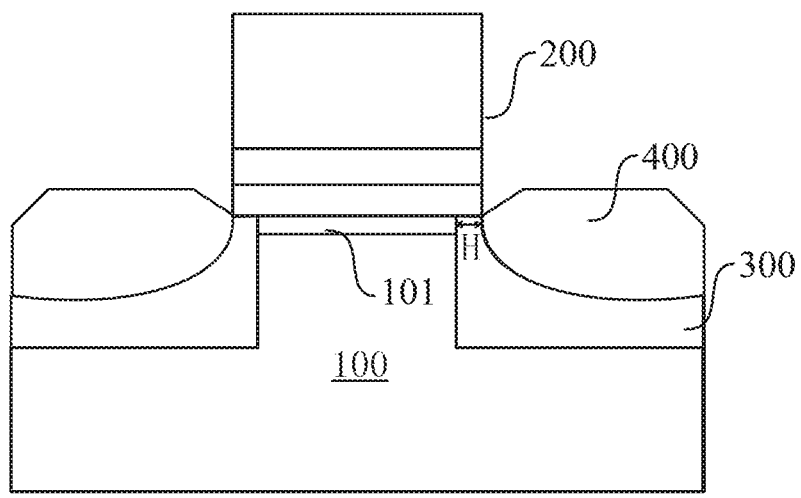
Figure 5:
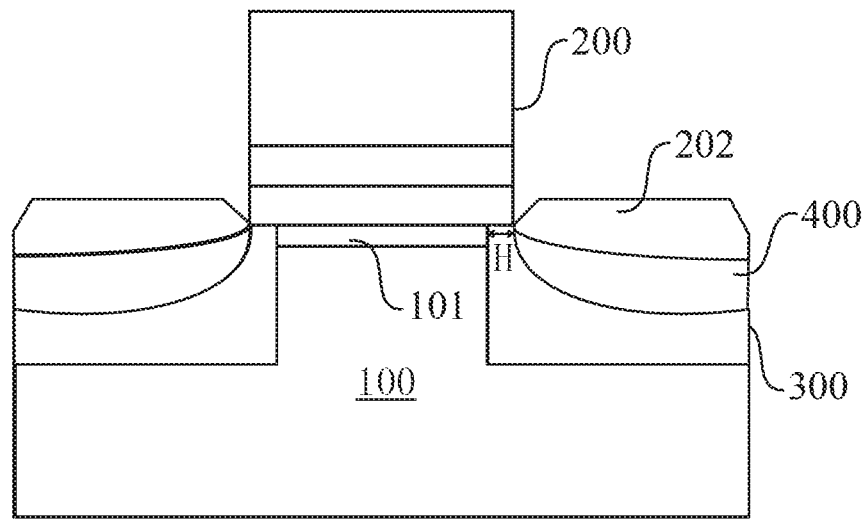

Next, the sacrificial spacer 102 is removed, and a second semiconductor layer 400 is filled into the vacancies 201 which are not filled up by the first semiconductor layer 300 of silicon. The second semiconductor layer 400 is formed of silicon or germanium, and the germanium in the silicon germanium of the second semiconductor layer 400 has a smaller percentage than the germanium in the silicon germanium channel layer 101. Specifically, the sacrificial spacer 102 may be removed by wet etching. And the second semiconductor layer 400 may be formed by epitaxial growing or CVD. Because the germanium in the second semiconductor layer 400 has a larger percentage that that in the silicon germanium channel layer 101 and has a larger band gap, the second semiconductor layer 400 may apply stress to the silicon germanium channel layer 101 due to mismatch of crystal lattice, and carrier mobility in the channel may be increased, and device performance may be further enhanced. In the present embodiment, preferably, the second semiconductor layer 400 is formed by silicon. The finished semiconductor structure is shown in FIG. 4.

Next, the substrate on both sides of the dummy gate structure may be doped to form source/drain extension regions. Halo implantation may also be performed to form halo implantation regions. The dopants for the source/drain extension regions may be the same as that of the device, and the dopants for halo implantation may be opposite to that of the device.

Figure 6:
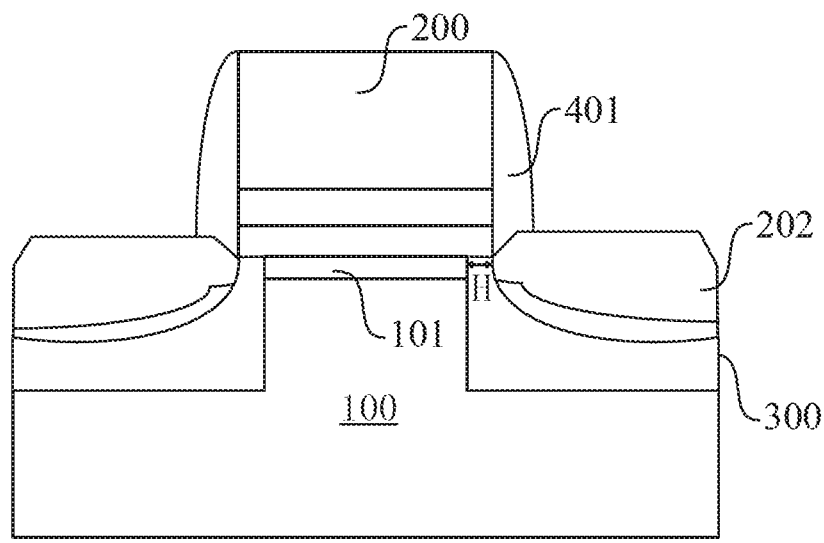

Optionally, a spacer 401 is formed on sidewalls of the gate stack to isolate the gate electrode, as shown in FIG. 6. Specifically, a sacrificial spacer dielectric layer of silicon nitride with a thickness of about 40-80 nm may be deposited by LPCVD. Then, the sacrificial spacer 102 of silicon nitride with a thickness of about 35-75 nm is formed on both sides of the gate electrode by a etching back process. The sacrificial spacer 102 may also be formed of silicon oxide, silicon oxynitride, silicon carbide or combinations thereof, and/or other materials as appropriate. The sacrificial spacer 102 may have a multi-layer structure. The sacrificial spacer 102 may also be formed by processes such as deposition and etching, and may have a thickness of about 10-100 nm, for example, 30 nm, 50 nm or 80 nm.

Next, a dielectric layer of silicon dioxide with a thickness of about 10-35 nm may be deposited on the semiconductor structure. Then, ion implantation may be performed to the source/drain regions with the dielectric layer as a buffer layer. For p-type crystal, the dopants may be B, $BF_2$, In, or Ga. For n-type crystal, the dopants may be P, As, or Sb. The doping concentration may be $5e10^{19}$ $cm^{-3}$-$1e10^{20}$ $cm^{-3}$.

Figure 7:
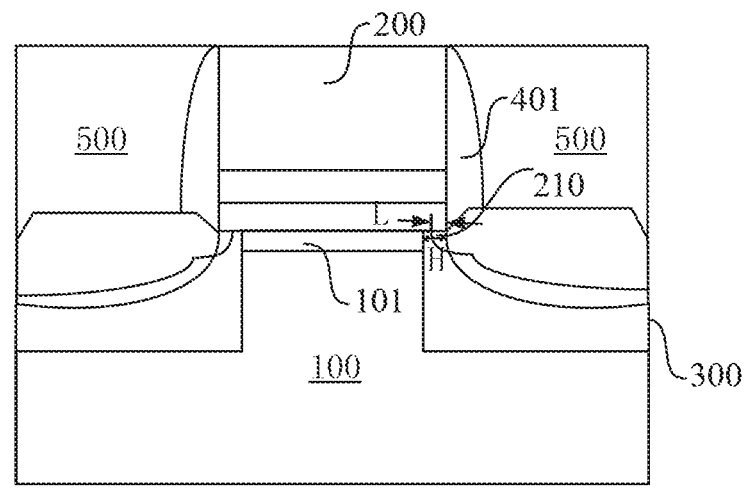

After the doping of the source/drain regions, an interlayer dielectric layer 500 is formed on the semiconductor structure. In the present embodiment, the interlayer dielectric layer 500 may be formed of silicon oxide. The semiconductor structure after depositing the interlayer dielectric layer 500 is shown in FIG. 7.

Next, the dummy gate structure 200 is removed to form a dummy gate vacancy. The dummy gate structure 200 may be removed by wet etching and/or dry etching. In one embodiment, plasma etching is performed.

Figure 8:
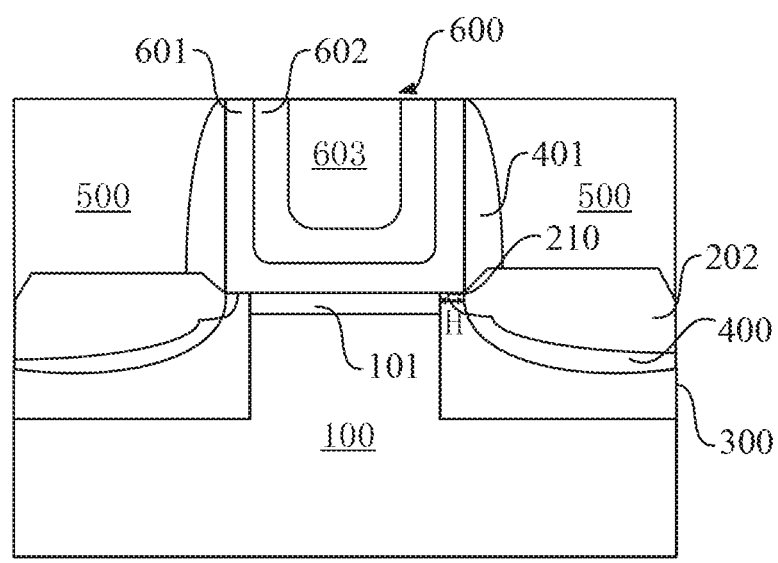

Next, as shown in FIG. 8, a gate stack is formed in the dummy gate vacancy. The gate stack may be a metal gate, or a composite gate of metal/polysilicon with silicide formed on the polysilicon.

Specifically, a gate dielectric layer 601 is formed in the dummy gate vacancy. Then, a work function adjusting layer 602 is deposited, and a metal gate layer 603 is formed on the work function adjusting layer. The gate dielectric layer 601 may be a thermal oxidation layer including silicon oxide and silicon oxynitride, or may be high-K dielectrics, such as one of HfAlON, HfSiAlON, HfTaAlON, HfTiAlON, HfON, HfSiON, HfTaON, HfTiON, $Al_2O_3$, $La_2O_3$, $ZrO_2$ and LaAlO, or combinations thereof, and the gate dielectric layer 601 may have a thickness of about 1-10 nm, such as 3 nm, 5 nm or 8 nm. The gate dielectric layer 601 may be formed by thermal oxidation, CVD or Atomic Layer Deposition (ALD).

The work function adjusting layer may be formed of TiN, TaN, etc., and may have a thickness of about 3-15 nm. The metal gate layer may be a single-layer or multi-layer structure. And the metal gate layer may be formed of one of TaN, TaC, TiN, TaAlN, TiAlN, MoAlN, TaTbN, TaErN, TaYbN, TaSiN, HfSiN, MoSiN, $RuTa_x$, and $NiTa_x$, or combinations. The metal gate layer may have a thickness of about 10-40 nm, for example, 20 nm or 30 nm.

Finally, a conventional CMOS back-end process may be performed, including depositing a passive layer, forming a contact hole and metalization, so as to achieve the super thin SOI MOS transistor.

Because the leakage current induced by the GIDL is closely related to the band gap of the semiconductor material in the GIDL region, and may decrease with the increase of the band gap of the semiconductor material, the band gap of the GIDL region may be effectively increased by replacing the silicon germanium channel layer with the first semiconductor layer 300 having a relative larger band gap, so as to reduce leakage current and enhance device performance. Because the germanium in the second semiconductor layer 400 has a larger percentage that that in the silicon germanium channel layer 101 and has a larger band gap, the second semiconductor layer 400 may apply stress to the silicon germanium channel layer 101 due to mismatch of crystal lattice, and carrier mobility in the channel may be increased, and device performance may be further enhanced.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a MOSFET, comprising:
  a. providing a substrate (100);
  b. forming a silicon germanium channel layer (101), a dummy gate structure (200) and a sacrificial spacer (102);
  c. removing the silicon germanium channel layer and portions of the substrate which are not covered by the dummy gate structure (200) and located under both sides of the dummy gate structure (200), so as to form vacancies (201);
  d. selectively epitaxially growing a first semiconductor layer (300) on the semiconductor structure to fill the bottom and sidewalls of the vacancies (201); and
  e. removing the sacrificial spacer (102) and filling a second semiconductor layer (400) in the vacancies which are not filled by the first semiconductor layer (300);
  f. forming source/drain extension regions, spacers (401), source/drain regions and an interlayer dielectric layer (500); wherein the length of the overlapping region between the vacancies (201) and the dummy gate structure (200) is bigger than the length of the source/drain extension regions.

2. The method of claim 1, wherein silicon germanium channel layer (101) has a thickness of about 3-6 nm.

3. The method of claim 1, wherein the vacancies (201) are formed by combination of anisotropic etching and isotropic etching.

4. The method of claim 1, wherein the overlapping length (H) of the vacancies (201) and the dummy gate structure (200) is about 5-10 nm.

5. The method of claim 1, wherein the first semiconductor layer (300) has a larger band gap than that of the silicon germanium channel layer (101).

6. The method of claim 1, wherein the first semiconductor layer (300) is formed of silicon.

7. The method of claim 1, wherein the second semiconductor layer (400) is formed of silicon or silicon germanium.

8. The method of claim 7, wherein the second semiconductor layer (400) is formed of silicon germanium, the germanium therein has a percentage smaller than that in the silicon germanium channel layer (101).

9. The method of claim 1, wherein the second semiconductor layer (400) is filled by epitaxial growing or CVD.

10. The method of claim 1, wherein after step f, the method further comprises:
  g. removing the dummy gate structure (200) to form dummy gate vacancies, and sequentially depositing a gate dielectric layer (601), a work function adjusting layer (602) and a metal gate layer (603) in the dummy gate vacancies.

11. The method of claim 5, wherein the first semiconductor layer (300) is formed of silicon.

* * * * *